(12) United States Patent
Yoo et al.

(10) Patent No.: US 9,806,287 B2
(45) Date of Patent: Oct. 31, 2017

(54) ENCAPSULATION FILM AND METHOD FOR ENCAPSULATING ORGANIC ELECTRONIC DEVICE USING SAME

(71) Applicant: LG CHEM, LTD., Seoul (KR)

(72) Inventors: Hyun Jee Yoo, Daejeon (KR); Hyun Suk Kim, Daejeon (KR); Suk Ky Chang, Daejeon (KR); Seung Min Lee, Daejeon (KR); Jung Ok Moon, Daejeon (KR)

(73) Assignee: LG Chem, Ltd., Seoul (KR)

( * ) Notice: Subject to any disclaimer, the term of this patent is extended or adjusted under 35 U.S.C. 154(b) by 46 days.

(21) Appl. No.: 14/890,818

(22) PCT Filed: May 21, 2014

(86) PCT No.: PCT/KR2014/004549
§ 371 (c)(1),
(2) Date: Nov. 12, 2015

(87) PCT Pub. No.: WO2014/189291
PCT Pub. Date: Nov. 27, 2014

(65) Prior Publication Data
US 2016/0118620 A1    Apr. 28, 2016

(30) Foreign Application Priority Data

May 21, 2013 (KR) .................. 10-2013-0057127
May 21, 2013 (KR) .................. 10-2013-0057307

(51) Int. Cl.
*H01L 51/52* (2006.01)
*H01L 51/00* (2006.01)
*H01L 51/56* (2006.01)

(52) U.S. Cl.
CPC ........ *H01L 51/5253* (2013.01); *H01L 51/004* (2013.01); *H01L 51/0035* (2013.01); *H01L 51/0094* (2013.01); *H01L 51/5259* (2013.01); *H01L 51/56* (2013.01); *H01L 2251/303* (2013.01)

(58) Field of Classification Search
CPC . H01L 51/52; H01L 51/5246; H01L 51/0035; H01L 51/5253
See application file for complete search history.

(56) References Cited

U.S. PATENT DOCUMENTS 6,226,890 B1    5/2001    Boroson et al.
8,232,350 B2    7/2012    Fujita et al.
(Continued)

FOREIGN PATENT DOCUMENTS

CN    101308864 A    11/2008
CN    102516821 A    7/2012
(Continued)

*Primary Examiner* — Phuc Dang
(74) *Attorney, Agent, or Firm* — Dentons US LLP (57) ABSTRACT

Provided are an encapsulation film, a product for encapsulating an organic electronic device (OED) using the same, and a method of encapsulating an OED. The encapsulation film may effectively block moisture or oxygen permeating into the OED from an external environment, prevent adhesion failure and damage to an organic film due to volume expansion occurring by a reaction between a moisture adsorbent and moisture, and provide high reliability due to increases in a lifespan and durability of the OED.

19 Claims, 2 Drawing Sheets

(56) References Cited

U.S. PATENT DOCUMENTS

| | | | | |
|---|---|---|---|---|
| 2008/0120946 A1* | 5/2008 | Bayne | .................... | B65D 81/05 53/396 |
| 2008/0309226 A1* | 12/2008 | Kim | .................... | H01L 51/5259 313/504 |
| 2010/0200846 A1* | 8/2010 | Kwack | ................ | H01L 51/5253 257/40 |
| 2012/0112340 A1* | 5/2012 | Lin | ........................ | H01L 21/568 257/734 |
| 2012/0256202 A1* | 10/2012 | Lee | .................... | H01L 51/5256 257/88 |
| 2012/0273975 A1 | 11/2012 | Hayashishita et al. | | |
| 2013/0008506 A1 | 1/2013 | Tanahashi et al. | | |
| 2013/0008613 A1 | 1/2013 | Henderson | | |
| 2015/0287940 A1 | 10/2015 | Yoo et al. | | |

FOREIGN PATENT DOCUMENTS

| | | | |
|---|---|---|---|
| CN | 102763211 | A | 10/2012 |
| CN | 103998238 | A | 8/2014 |
| EP | 1849593 | A1 | 10/2007 |
| EP | 2637229 | A2 | 9/2013 |
| JP | 9-148066 | A | 6/1997 |
| JP | 2006130855 | A | 5/2006 |
| JP | 2007-298732 | A | 11/2007 |
| JP | 2011-526629 | A | 10/2011 |
| JP | 2012-229392 | A | 11/2012 |
| KR | 10-2007-0072400 | A | 7/2007 |
| KR | 10-2012-0046704 | A | 5/2012 |
| KR | 10-2012-0055487 | A | 5/2012 |
| TW | 201236873 | A | 9/2012 |
| WO | 2012/060621 | A2 | 5/2012 |

\* cited by examiner

ENCAPSULATION FILM AND METHOD FOR ENCAPSULATING ORGANIC ELECTRONIC DEVICE USING SAME

This application is a National Stage Entry of International Application No. PCT/KR2014/004549, filed May 21, 2014, which application claims the benefit and priority to Korean Application Nos. KR 10-2013-0057127, filed May 21, 2013 and KR 10-2013-0057307, filed May 21, 2013 all of which are incorporated by reference in their entirety for all purposes as is fully set forth herein.

BACKGROUND

1. Field of the Invention

The present application relates to an encapsulation film and a method of encapsulating an organic electronic device (OED) using the same.

2. Discussion of Art

An OED is a device including an organic material layer generating exchange of charges using holes and electrons, and may be, for example, a photovoltaic device, a rectifier, a transmitter, and an organic light emitting diode (OLED).

An OLED among the OEDs consumes less power and has a higher response speed than conventional light sources, and is preferable as a thin display device or light. In addition, the OLED has excellent space utilization, and thus is expected to be applied in various fields including all kinds of portable devices, monitors, notebook computers, and TVs.

To expand compatibility and use of the OLED, the most important problem is durability. Organic materials and metal electrodes included in the OLED are very easily oxidized by external factors such as moisture, and a product including the OLED is very sensitive to environmental factors. Recently, as a panel becomes larger and a bezel becomes shorter, thereby decreasing a distance between an external atmosphere and an organic diode, when the OLED is encapsulated using the same material as the previously used material, device reliability due to moisture permeation is reduced. When a content of a moisture adsorbing agent to compensate for a shorter bezel is increased, an absolute value of expansion by a reaction with moisture becomes higher, and thus failure of adhesion or damage to lower layers may occur. Accordingly, various methods have been suggested to effectively prevent permeation of oxygen or moisture into the OED such as an OLED.

Conventionally, a method of processing a metal can or glass in the form a cap having a groove and loading a powder-type desiccant absorbing moisture in the groove, or processing a metal can or glass in a film type and adhering it using a double-sided tape.

In Japanese Patent Laid-Open Publication No. Hei 9-148066, an organic EL diode including a stacked structure having a structure in which an organic emitting layer formed of an organic compound is disposed between a pair of electrodes facing each other, an airtight container blocking such a stacked structure from an external atmosphere, an alkali metal oxide contained in the airtight container, and a drying means such as the alkali metal oxide is disclosed. However, such an organic EL diode is increased in a total thickness of the display device due to the shape of the airtight container, is vulnerable to a physical impact due to an internal space, and has a poor dissipating characteristic when manufactured in a large scale.

In U.S. Pat. No. 6,226,890, a method of drying an electric diode employing a moisture absorbing layer formed using a moisture adsorbent including a solid particle having a particle size of 0.1 to 200 μm and a binder is disclosed, but the method does not provide sufficient moisture adsorbability. When a water vapor transmission rate (WVTR) in a cured state does not meet 50 g/m²·day or less due to the characteristic of the binder surrounding the moisture adsorbent, a moisture adsorption speed is high during an acceleration test, and thus the diode cannot exhibit sufficient performance.

To improve this, according to Korean Unexamined Patent Application No. 2007-0072400, a speed of permeating moisture into an OLED may be reduced by adding a moisture adsorbent to an epoxy sealant to chemically adsorb moisture in the OLED, but expansion of a volume caused by a reaction between the moisture adsorbent and moisture can make physical damage to the OLED. In addition, when a metal oxide is used as a moisture adsorbent, it may react with moisture, thereby producing a strong base material to chemically damage a protective layer and a negative electrode layer.

Therefore, there are demands for developing encapsulants which can ensure long-term reliability, effectively prevent permeation of moisture, and reduce damages to the OED.

SUMMARY OF THE INVENTION

The present application is directed to providing an encapsulation film, a product for encapsulating an OED using the same, and a method of encapsulating an OED.

Hereinafter, with reference to the accompanying drawings, exemplary embodiments of the present application will be described in further detail. In addition, to explain the present application, detailed descriptions for known general functions or configurations will be omitted. In addition, the accompanying drawings are schematically provided to help in understanding the present application, and to more clearly explain the present application, parts that do not relate to the descriptions will be omitted, thicknesses are exaggerated to clearly express several layers and regions, and the scope of the present application is not limited by thicknesses, sizes, and ratios shown in the drawings.

One aspect of the present application provides a film for encapsulating an OED. The encapsulation film according to an exemplary embodiment of the present application includes a multilayer encapsulating layer that may be attached to an entire surface of the OED.

The term "organic electronic device (OED)" used herein refers to a product or device having a structure including an organic material layer generating exchange of charges using holes and electrons between a pair of electrodes facing each other, and may be, but is not limited to, for example, a photovoltaic device, a rectifier, a transmitter, and an organic light emitting diode (OLED). In one exemplary embodiment of the present application, the OED may be an OLED.

According to an exemplary embodiment of the present application, an encapsulation film including an encapsulating layer including a moisture barrier layer and a crack barrier layer is provided. The encapsulation film may include at least one moisture barrier layer and at least one crack barrier layer, and further include a separate layer, other than the moisture barrier layer and the crack barrier layer.

In one example, the encapsulation film according to the present application is an encapsulation film encapsulating an OED, which includes a crack barrier layer having a tensile modulus of 0.001 to 500 MPa and a moisture barrier layer having a tensile modulus of 500 to 1000 MPa, and the crack barrier layer may be formed to be in contact with an OED upon encapsulation of the OED. That is, the crack barrier layer may be formed to encapsulate an entire surface of the OED upon encapsulation of the OED. The tensile modulus of the crack barrier layer may be lower than that of the moisture barrier layer.

Materials for the crack barrier layer and the moisture barrier layer according to the present application are not particularly limited as long as they satisfy the range of the tensile modulus. The tensile modulus used herein is a tensile modulus measured at a temperature of 25° C. unless particularly defined otherwise. In addition, the tensile modulus used in the specification may refer to a tensile modulus of a curable component measured after curing unless particularly defined otherwise. In one example, the tensile modulus may refer to a tensile modulus measured after curing at approximately 100° C. for approximately 120 minutes, a tensile modulus measured after radiating UV rays at a radiation dose of approximately 1 J/cm$^2$ or more, or a tensile modulus measured after thermal curing is additionally performed after UV radiation.

As described above, the crack barrier layer may have a tensile modulus of 0.001 to 500 MPa at room temperature, and for example, 0.001 MPa to 490 Mpa, 0.001 MPa to 480 Mpa, 0.001 MPa to 470 Mpa, 0.001 MPa to 460 Mpa, 0.001 MPa to 450 Mpa, 0.001 MPa to 440 Mpa, 0.001 MPa to 430 Mpa, 0.001 MPa to 420 Mpa, 0.001 MPa to 410 Mpa, 0.001 MPa to 400 Mpa, 0.05 MPa to 450 Mpa, 0.1 MPa to 450 Mpa, 0.2 MPa to 450 Mpa, 0.3 MPa to 450 Mpa, 0.5 MPa to 450 Mpa, or 0.5 MPa to 450 Mpa. In addition, the moisture barrier layer may have a tensile modulus of 500 MPa to 1000 Mpa, 530 MPa to 1000 Mpa, 550 MPa to 980 Mpa, 580 MPa to 950 Mpa, 600 MPa to 930 Mpa, 630 MPa to 900 Mpa, or 650 MPa to 900 Mpa at room temperature. As described above, when the tensile modulus of the crack barrier layer is lower than that of the moisture barrier layer, it is preferable to be applied to a large-scale device, and effective moisture preventability may be provided to the film by controlling a ratio between layers of the moisture adsorbent that will be described below. The term "moisture adsorbent" used herein may refer to a material capable of removing moisture to vapor permeating into the encapsulation film through a chemical reaction. Conventionally, when the moisture adsorbent reacts with moisture in the film, a volume is expanded as the moisture adsorbent reacts with moisture, thereby generating a stress. Accordingly, when the moisture adsorbent does not have elasticity sufficient to reduce an expansion stress for removing moisture, the film may be peeled off from an adherent. Any one of the multilayer encapsulating layer having a poor interface adhesive characteristic to an organic diode panel may have interlayer failure or cracks. For example, when an elastic modulus of the encapsulating layer is controlled to a low level, peeling by the stress may be prevented. That is, when two layers having different elastic moduli are stacked, and the crack barrier layer having a low elastic modulus is disposed in contact with the OED, although the moisture adsorbent of the moisture barrier layer reacts with moisture, thereby generating a stress, the crack barrier layer can serve to reduce the stress. In addition, other physical properties such as durability of the film may also be satisfied.

In an exemplary embodiment of the present application, the encapsulating layer may have a water vapor transmission rate (WVTR) measured in a thickness direction of the film while manufactured in a film having a thickness of 100 μm of 50 g/m$^2$·day or less, 40 g/m$^2$·day or less, 30 g/m$^2$·day or less, 20 g/m$^2$·day or less, or 10 g/m$^2$·day or less at 100° F. and a relative humidity of 100%. The encapsulating layer is formed to have such a WVTR to effectively block moisture or oxygen permeating from an external environment when applied to an encapsulation structure of an electronic device, thereby realizing an encapsulation structure that can stably protect a diode. As the WVTR is lower, excellent moisture preventability may be exhibited, and thus the lower limit thereof may be, but is not particularly limited to, for example, 0 g/m$^2$·day.

The term "encapsulating layer" used herein may refer to all kinds of layers constituting an encapsulation film. That is, the term "encapsulating layer" used herein may refer to each of a moisture barrier layer, a crack barrier layer, and a laminating layer that will be described below, and a multilayer structure including all of the layers.

The encapsulation film may have various structures, including a structure in which a crack barrier layer is disposed on one surface of a moisture barrier layer and a structure in which a crack barrier layer is disposed on both surfaces of a moisture barrier layer. Here, in the structure in which the crack barrier layer is disposed on one or both surfaces of the moisture barrier layer, a structure in which a crack barrier layer is directly attached to a moisture barrier layer, and a structure in which a crack barrier layer is indirectly attached to a moisture barrier layer via a separate layer may be included.

In one exemplary embodiment of the present application, the crack barrier layer and the moisture barrier layer of the encapsulation film may include an encapsulation resin or a moisture adsorbent. The term "encapsulation resin" used herein refers to a base resin constituting a moisture barrier layer, a crack barrier layer, or a laminating layer. For example, the crack barrier layer may include an encapsulation resin having a glass transition temperature of 0° C. or less. In addition, the moisture barrier layer may include an encapsulation resin having a glass transition temperature of 85° C. or more. However, the present application is not limited to the above-described range, but as long as satisfying the above-described elastic modulus, the crack barrier layer may include an encapsulation resin having a glass transition temperature of 85° C. or more, and alternatively, the moisture barrier layer may include an encapsulation resin having a glass transition temperature of 0° C. or less.

Through such a multilayer encapsulating layer, a required lifespan of the OED may be ensured, moisture permeation may be effectively prevented, and chemical and physical damages to the OED may be prevented. The encapsulating layer may have a multilayer structure by separating a crack barrier layer from a moisture barrier layer through any method of forming the multilayer encapsulating layer known in the art without limitation. In addition, a kind and a content of a component constituting a crack barrier layer, a moisture barrier layer, and a laminating layer of the encapsulating layer, for example, an encapsulation resin, a moisture adsorbent, a tackifier, a curing agent, another additive or a filler may be the same as or different from each other.

That is, as a component constituting an encapsulating layer, any known material that provides an encapsulating layer satisfying the above-described tensile modulus can be used without particular limitation. In addition, if a material does not satisfy the tensile modulus alone but satisfies the tensile modulus in combination, it may be used as a component constituting an encapsulating layer.

In an exemplary embodiment of the present application, the encapsulation resin may be a resin having a glass transition temperature of 0° C. or less, for example, –10° C. or less, –20° C. or less, –30° C. or less, or –40° C. or less. In still another example, the encapsulation resin may have a glass transition temperature of 85° C. or more, 90° C. or more, 95° C. or more, or 100° C. or more. The glass transition temperature in the specification may refer to a glass transition temperature after curing at approximately 100° C. for approximately 120 minutes, a glass transition temperature after radiating UV rays at a radiation dose of 1 J/cm$^2$ or more, or a glass transition temperature after further performing thermal curing after UV radiation.

In one example, the encapsulation resin having a glass transition temperature of 0° C. or less may be a styrene-based resin or elastomer, a polyolefin-based resin or elastomer, other elastomers, a polyoxyalkylene-based resin or elastomer, a polyester-based resin or elastomer, a polyvinylchloride-based resin or elastomer, a polycarbonate-based resin or elastomer, a polyphenylenesulfide-based resin or elastomer, a mixture of hydrocarbon, a polyamide-based resin or elastomer, an acrylate-based resin or elastomer, an epoxy-based resin or elastomer, a silicon-based resin or elastomer, a fluorine-based resin or elastomer, or a mixture thereof.

Here, the styrene-based resin or elastomer may be, for example, a styrene-ethylene-butadiene-styrene (SEBS) block copolymer, a styrene-isoprene-styrene (SIS) block copolymer, an acrylonitrile-butadiene-styrene (ABS) block copolymer, an acrylonitrile-styrene-acrylate (ASA) block copolymer, a styrene-butadiene-styrene (SBS) block copolymer, a styrene-based homopolymer, or a mixture thereof. The olefin-based resin or elastomer may be, for example, a high-density polyethylene-based resin or elastomer, a low-density polyethylene-based resin or elastomer, a polypropylene-based resin or elastomer, or a mixture thereof. The elastomer may be, for example, an ester-based thermoplastic elastomer, an olefin-based elastomer, a silicon-based elastomer, an acryl-based elastomer, or a mixture thereof. Among these, the olefin-based thermoplastic elastomer may be a polybutadiene resin or elastomer or a polyisobutylene resin or elastomer. The polyoxyalkylene-based resin or elastomer may be, for example, a polyoxymethylene-based resin or elastomer, a polyoxyethylene-based resin or elastomer, or a mixture thereof. The polyester-based resin or elastomer may be, for example, a polyethylene terephthalate-based resin or elastomer, a polybutylene terephthalate-based resin or elastomer, or a mixture thereof. The polyvinylchloride-based resin or elastomer may be, for example, polyvinylidene chloride. The mixture of hydrocarbon may be, for example, hexatriacotane or paraffin. The polyamide-based resin or elastomer may be, for example, nylon. The acrylate-based resin or elastomer may be, for example, polybutyl(meth)acrylate. The epoxy-based resin or elastomer may be, for example, a bisphenol-type such as a bisphenol A-type, a bisphenol F-type, a bisphenol S-type, and a hydrogenated product thereof; a novolac-type such as a phenol novolac-type or a cresol novolac-type; a nitrogen-containing ring-type such as a triglycidylisocyanurate-type or a hydantoin-type; an alicyclic-type; an aliphatic-type; an aromatic-type such as a naphthalene-type or a biphenyl-type; a glycidyl-type such as a glycidylether-type, a glycidylamine-type, or a glycidylester-type; a dicyclo-type such as a dicyclopentadiene-type; an ester-type; an etherester-type; or a mixture thereof. The silicon-based resin or elastomer may be, for example, polydimethylsiloxane. In addition, the fluorine-based resin or elastomer may be a polytrifluoroethylene resin or elastomer, a polytetrafluoroethylene resin or elastomer, a polychlorotrifluoroethylene resin or elastomer, a polyhexafluoropropylene resin or elastomer, polyfluorinated vinylidene, polyfluorinated vinyl, polyfluorinated ethylenepropylene, or a mixture thereof.

The listed resin or elastomer may be grafted with maleic anhydride, copolymerized with a monomer for preparing another listed resin or elastomer, or a resin or an elastomer, and modified by another compound. The compound may be a carboxyl-terminated butadiene-acrylonitrile copolymer.

In one exemplary embodiment, as the encapsulation resin, a copolymer of an olefin-based compound including a carbon-carbon double bond may be included, but the present application is not limited.

In addition, the encapsulation resin may be a copolymer of a diene and an olefin-based compound including a carbon-carbon double bond. Here, the olefin-based compound may include isobutylene, propylene, or ethylene, the diene may be a monomer that can be polymerized with the olefin-based compound, and may include, for example, 1-butene, 2-butene, isoprene, or butadiene. That is, the encapsulation resin of the present application may be, for example, a homopolymer of an isobutylene monomer; a copolymer prepared by copolymerizing a monomer that can be polymerized with an isobutylene monomer; or a mixture thereof. In one example, a copolymer of an olefin-based compound including a carbon-carbon double bond and a diene may be butyl rubber.

The encapsulation resin may have a weight average molecular weight (Mw) as can be molded in the form of a film. For example, the resin may have a weight average molecular weight (Mw) of approximately 100,000 to 2,000,000, 100,000 to 1,500,000, or 100,000 to 1,000,000. The term "weight average molecular weight (Mw)" refers to a conversion value for standard polystyrene measured by gel permeation chromatography (GPC). However, the resin or elastomer component may not have the above-described weight average molecular weight (Mw). For example, when the molecular weight of the resin or elastomer component is not in a sufficient level to form a film, a separate binder resin may be added to a component constituting an encapsulating layer.

In yet another example, the encapsulation resin having a glass transition temperature of 85° C. or more may include a curable resin. In one example, a component constituting a moisture barrier layer of the above-described encapsulating layer may include a curable resin, but the present application is not particularly limited as long as the moisture barrier layer satisfies the tensile modulus or glass transition temperature.

A specific kind of the curable resin that can be used in the present application is not particularly limited, and for example, various heat-curable or photocurable resins known in the art may be used. The "heat-curable resin" used herein may refer to a resin that can be cured by suitable heat application or an aging process, and the term "photocurable resin" refers to a resin that can be cured by radiation of electromagnetic waves. In addition, here, in the category of the electromagnetic waves, microwaves, IR rays, UV rays, X rays, γ rays. and particle beams such as α-particle beams, proton beams, neutron beams, and electron beams. In the present application, as an example of the photocurable resin, a cationic photocurable resin may be used. The cationic photocurable resin refers to a resin that can be cured by cationic polymerization or a cationic curing reaction induced by radiation of electromagnetic waves. In addition, the curable resin may be a dual curable resin having both heat-curable and photocurable characteristics.

A specific kind of a curable resin that can be used in exemplary embodiments of the present application is not particularly limited, as long as the curable resin has the above-described characteristics. For example, a resin that can be cured to exhibit adhesive characteristics may include a resin including at least one heat-curable functional group selected from a glycidyl group, an isocyanate group, a hydroxyl group, a carboxyl group, or an amide group, or at least one functional group capable of being cured by the radiation of an electromagnetic wave, selected from an epoxide group, a cyclic ether group, a sulfide group, an acetal group, and a lactone group. In addition, a specific kind of the resin may include an acryl resin, a polyester resin, an isocyanate resin, or an epoxy resin, but the present application is not limited thereto.

As the curable resin in the present application, an aromatic or aliphatic, or a linear or branched epoxy resin may be used. In one exemplary embodiment of the present application, an epoxy resin containing at least two functional groups and an epoxy equivalent of 180 to 1,000 g/eq may be used. When the epoxy resin having the above epoxy equivalent is used, characteristics such as adhesive performance and a glass transition temperature of the cured product may be effectively maintained. Such an epoxy resin may be one or a mixture of at least two of a cresol novolac epoxy resin, a bisphenol A-type epoxy resin, a bisphenol A-type novolac epoxy resin, a phenol novolac epoxy resin, a 4-functional epoxy resin, a biphenyl-type epoxy resin, a triphenolmethane-type epoxy resin, an alkyl-modified triphenolmethane epoxy resin, a naphthalene-type epoxy resin, a dicyclopentadiene-type epoxy resin, and a dicyclopentadiene-modified phenol-type epoxy resin.

In the present application, an epoxy resin including a cyclic structure in a molecular structure may be used, and for example, an epoxy resin including an aromatic group (e.g., a phenyl group) may be used. When the epoxy resin includes an aromatic group, a cured product may have excellent thermal and chemical stabilities and low moisture absorption, thereby enhancing reliability of an encapsulation structure of an OED. The aromatic group-containing epoxy resin may be, but is not limited to, one or a mixture of at least two of a biphenyl-type epoxy resin, a dicyclopentadiene-type epoxy resin, a naphthalene-type epoxy resin, a dicyclopentadiene-modified phenol-type epoxy resin, a cresol-based epoxy resin, a bisphenol-based epoxy resin, a xyloc-based epoxy resin, a multifunctional epoxy resin, a phenol novolac epoxy resin, a triphenolmethane-type epoxy resin, and an alkyl-modified triphenolmethane epoxy resin.

In the present application, an epoxy resin including a cyclic structure in a molecular structure may be used, and an epoxy resin including an aromatic group (for example, a phenyl group) is preferably used. When the epoxy resin includes an aromatic group, a cured product may have excellent thermal and chemical stabilities and low moisture absorption, thereby enhancing reliability of the encapsulation structure of the OED. Specifically, an example of the epoxy resin containing an aromatic group that can be used in the present application may be, but is not limited to, one or a mixture of at least two of a biphenyl-type epoxy resin, a dicyclopentadiene-type epoxy resin, a naphthalene-type epoxy resin, a dicyclopentadiene-modified phenol-type epoxy resin, a cresol-based epoxy resin, a bisphenol-based epoxy resin, a xyloc-based epoxy resin, a multifunctional epoxy resin, a phenol novolac epoxy resin, a triphenolmethane-type epoxy resin, and an alkyl-modified triphenolmethane epoxy resin.

In the specification, preferably, the epoxy resin is a silane-modified epoxy resin, and more preferably, a silane-modified epoxy resin having an aromatic group. Likewise, when an epoxy resin modified with a silane to structurally have a silane group is used, an adhesive property of the OED to a glass substrate or a substrate inorganic material is maximized, and a moisture barrier property or durability and reliability may be enhanced. Such a specific kind of the epoxy resin that can be used in the present application is not particularly limited, and the resin may be easily obtained from a manufacturer, for example, Kukdo Chemical, Co., Ltd.

In exemplary embodiments of the present application, the encapsulation film for encapsulating the OED includes an encapsulating layer, which has a multilayer structure including a crack barrier layer in contact with the OED during encapsulation of the OED and a moisture barrier layer not in contact with the OED. In addition, based on a total weight of a moisture adsorbent in the encapsulation film, the crack barrier layer includes a moisture adsorbent at 0 to 20%, 0 to 18%, 0 to 16%, 0 to 14%, 0 to 12%, 0 to 10%, 0 to 8%, 0 to 6%, 0 to 4%, or 0 to 2%. In addition, the moisture barrier layer includes a moisture adsorbent at 80 to 100%, 82 to 100%, 84 to 100%, 86 to 100%, 88 to 100%, 90 to 100%, 92 to 100%, 94 to 100%, 96 to 100%, or 98 to 100%. When the content of the moisture adsorbent in the crack barrier layer close to the OED is higher than 20%, the moisture adsorbent, like impurities, may press the OED, resulting in a physical damage thereto, and may release an excessive amount of ionic materials after reaction with moisture, resulting in a chemical damage to an anode or an inorganic protective film.

The term "moisture adsorbent" may refers to any component that can adsorb or remove moisture or vapor input from an external environment through a physical or chemical reaction. That is, the moisture adsorbent means a reactive or physical adsorbent, or a mixture thereof.

The moisture reactive adsorbent chemically reacts with vapor, moisture, or oxygen permeating into the encapsulating layer to adsorb moisture or vapor. The physical adsorbent may extend a path of moisture or vapor permeating into the encapsulation structure to prevent the permeation, and maximize preventability to moisture and vapor through a matrix structure of the encapsulation resin and an interaction with the moisture reactive adsorbent.

The specific kind of the moisture adsorbent that can be used in the present application may be, but is not particularly limited to, one or a mixture of at least two of metal powder such as alumina, a metal oxide, a metal salt, or phosphorus pentoxide ($P_2O_5$) in the case of the moisture reactive adsorbent, and silica, zeolite, titania, zirconia, or montmorillonite in the case of the physical adsorbent.

Here, specifically, the metal oxide may be phosphorus pentoxide ($P_2O_5$), lithium oxide ($Li_2O$), sodium oxide ($Na_2O$), barium oxide (BaO), calcium oxide (CaO), or magnesium oxide (MgO), and the metal salt may be, but is not limited to, a metal halogenated product such as a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$), or magnesium iodide ($MgI_2$); or a metal chlorate such as barium perchlorate ($Ba(ClO_4)_2$) or magnesium perchlorate ($Mg(ClO_4)_2$).

In the present application, the moisture adsorbent such as the metal oxide may be suitably processed, and added to the composition. For example, depending on the kind of the OED to which the encapsulation film is applied, the encapsulating layer may be a thin film having a thickness of 30 μm or less, and in this case, a grinding process of the moisture adsorbent may be needed. To grind the moisture adsorbent, three-roll milling, bead milling, or ball milling may be used. In addition, when the encapsulation film of the present application is used in a top-emissive OED, a permeability of the encapsulating layer is very important, and thus the moisture adsorbent should have a small size. Accordingly, for such a use, the grinding process may also be needed.

The moisture barrier layer of the encapsulating layer of the present application may include a moisture adsorbent at 1 to 100 parts by weight, and preferably 5 to 50 parts by weight relative 100 parts by weight of the encapsulation resin. As the content of the moisture adsorbent is controlled to 5 parts by weight or more, the encapsulating layer may exhibit excellent moisture and vapor preventing properties. In addition, as the content of the moisture adsorbent is controlled to 50 parts by weight or less, the encapsulating layer may be formed in a thin film having an encapsulation structure, and exhibit excellent moisture preventability.

In the specification, unless particularly defined otherwise, the unit "parts by weight" means a weight ratio between components.

In addition, accordingly, the crack barrier layer of the encapsulating layer of the present application may include the moisture adsorbent at 0 to 10 parts by weight relative 100 parts by weight of the encapsulation resin. When the moisture adsorbent is included at 0 parts by weight, the moisture adsorbent is not present in the crack barrier layer but present only in the moisture barrier layer. As the content of the moisture adsorbent is controlled to 10 parts by weight or less, the moisture preventability may be maximized, and physical and chemical damages to the OED due to the moisture adsorbent may be minimized.

In an exemplary embodiment of the present application, the encapsulating layer of the encapsulation film may further include a laminating layer. The laminating layer may be included below the crack barrier layer, and in this case, the laminating layer may be formed to be in contact with the OED upon encapsulation of the OED. The laminating layer may include the above-described encapsulation resin or moisture adsorbent. For example, the laminating layer may include the above-described curable resin. The laminating layer may serve to enhance a laminating property and processability when the crack barrier layer or moisture barrier layer is encapsulated by the OED.

In an exemplary embodiment of the present application, the encapsulating layer may further include a tackifier according to the kind of the encapsulation resin. For example, the crack barrier layer may further include a tackifier, in addition to the above-described encapsulation resin. The tackifier may be, for example, a hydrogenated petroleum resin obtained by hydrogenating a petroleum resin. The hydrogenated petroleum resin may be partially or completely hydrogenated, and may be a mixture of such resins. Such a tackifier may have high compatibility with a component constituting the encapsulating layer and an excellent moisture preventability. The specific hydrogenated petroleum resin may be a hydrogenated terpene-based resin, a hydrogenated ester-based resin, or a hydrogenated dicyclopentadiene-based resin. The tackifier may have a weight average molecular weight of approximately 200 to 5,000. A content of the tackifier may be suitably controlled as needed.

For example, the tackifier may be included in a first layer at 5 to 100 parts by weight relative 100 parts by weight of the encapsulation resin.

The encapsulating layer may include various additives according to a use of the film and a process of manufacturing a film, in addition to the above-described components. For example, in consideration of durability and processability, a curable material may be further included in the crack barrier layer. Here, the curable material may mean a material having a heat-curable functional group and/or an active energy beam-curable functional group separately included in addition to the components constituting the crack barrier layer. In addition, a content of the curable material included in the crack barrier layer may be controlled according to a desired physical property of the film.

In an exemplary embodiment of the present application, the encapsulating layer may further include a curing agent according to the kind of the encapsulation resin. For example, through a reaction with the above-described encapsulation resin, a curing agent that may form a cross-linking structure or an initiator that may initiate a curing reaction of the resin may further be included.

A suitable kind of the curing agent may be selected and used depending on the kind of the encapsulation resin or a functional group included in the resin.

In one example, when the encapsulation resin is an epoxy resin, as the curing agent, for example, a curing agent of an epoxy resin known in the art, at least one or two of an amine curing agent, an imidazole curing agent, a phenol curing agent, a phosphorous curing agent, and an acid anhydride curing agent may be used, but the present application is not limited.

In one example, the curing agent may be an imidazole compound which is a solid at room temperature and has a melting point or a degradation temperature of 80° C. or more. Such a compound may be, but is not limited to, 2-methyl imidazole, 2-heptadecyl imidazole, 2-phenyl imidazole, 2-phenyl-4-methyl imidazole, or 1-cyanoethyl-2-phenyl imidazole.

A content of the curing agent may be selected according to components of the composition, for example, a kind or ratio of the encapsulation resin. For example, the curing agent may be included at 1 to 20 parts by weight, 1 to 10 parts by weight, or 1 to 5 parts by weight relative 100 parts by weight of the encapsulation resin. However, the weight ratio may be changed according to a kind and a ratio of the encapsulation resin or a functional group of the resin, or a crosslinking density to be realized.

When the encapsulation resin is a resin that can be cured by radiation of active energy beams, as an initiator, for example, a cationic photopolymerization initiator may be used.

As the cationic photopolymerization initiator, an onium salt or organometallic salt-series ionized cationic initiator, or an organic silane or latent sulfonic acid-series or non-ionized cationic photopolymerization initiator may be used. The onium salt-series initiator may be a diaryliodonium salt, a triarylsulfonium salt, or an aryldiazonium salt, the organic metal salt-series initiator may be iron arene, the organic silane-series initiator may be o-nitrobenzyl triaryl silyl ether, triaryl silyl peroxide, or acyl silane, and the latent sulfonic acid-series initiator may be α-sulfonyloxy ketone or α-hydroxymethylbenzoin sulfonate, but the present application is not limited thereto.

In one example, as the cationic initiator, an ionized cationic photopolymerization initiator may be used.

In addition, when the encapsulation resin is a resin that can be cured by radiation of active energy beams, as the initiator, for example, a radical initiator may be used.

The radical initiator may be a photoinitiator or thermal initiator. A specific kind of the photoinitiator may be suitably selected in consideration of a curing speed and yellowing probability. For example, the photoinitiator may be a benzoin-, hydroxy ketone-, amino ketone-, or phosphine oxide-based photoinitiator, and specifically, benzoin, benzoin methylether, benzoin ethylether, benzoin isopropylether, benzoin n-butylether, benzoin isobutylether, acetophenone, dimethylamino acetophenone, 2,2-dimethoxy-2-phenylacetophenone, 2,2-diethoxy-2-phenylacetophenone, 2-hydroxy-2-methyl-1-phenylpropane-1-one, 1-hydroxy cyclohexylphenylketone, 2-methyl-1-[4-(methylthio)phenyl]-2-morpholino-propane-1-one, 4-(2-hydroxyethoxy)phenyl-2-(hydroxy-2-propyl)ketone, benzophenone, p-phenylbenzophenone, 4,4'-diethylamino benzophenone, dichlorobenzophenone, 2-methylanthraquinone, 2-ethylanthraquinone, 2-t-butylanthraquinone, 2-amino anthraquinone, 2-methylthioxanthone, 2-ethylthioxanthone, 2-chlorothioxanthone, 2,4-dimethylthioxanthone, 2,4-diethylthioxanthone, benzyldimethylketal, acetophenone dimethylketal, p-dimethylamino benzoic acid ester, oligo[2-hydroxy-2-methyl-1-[4-(1-methylvinyl)phenyl]propanone], or 2,4,6-trimethylbenzoyl-diphenyl-phosphineoxide.

A content of the initiator, like the curing agent, may be changed according to the kind and ratio of the encapsulation resin or a functional group of the resin, or a crosslinking density to be realized. For example, the initiator may be included at 0.01 to 10 parts by weight or 0.1 to 3 parts by weight relative 100 parts by weight of the encapsulation resin.

In addition to the above-described components, various materials may be included in the encapsulating layer according to a use of the film and a process of manufacturing a film. For example, when the encapsulating layer is molded in a film or sheet type, in consideration of moldability, a binder resin may be included in the moisture barrier layer.

In one exemplary embodiment of the present application, the encapsulating layer may include a filler, and preferably, an inorganic filler. The filler may extend a path of moisture or vapor permeating into the encapsulation structure to prevent the permeation, and maximize preventability to moisture and vapor through an interaction with the encapsulation resin and the moisture adsorbent. A specific kind of the filler that can be used in the present application may be, but is not particularly limited to, for example, one or a mixture of at least two of clay, talc, and needle-like silica.

In the present application, to increase a binding efficiency between a filler and an organic binder, as the filler, a product which is surface-treated with an organic material may be used, or a coupling agent may be further added.

The encapsulating layer of the present application may include a filler at 1 to 50 parts by weight, and preferably 1 to 20 parts by weight relative 100 parts by weight of the encapsulation resin. As the content of the filler is controlled to 1 part by weight or more, a cured product having an excellent moisture or vapor blocking property and excellent mechanical properties may be provided. In addition, in the present application, as the content of the filler is controlled to 50 parts by weight or less, a film-type encapsulating layer can be manufactured, and although the encapsulating layer is formed in a thin film, an encapsulation structure exhibiting an excellent moisture blocking characteristic may be provided.

The encapsulation film of the present application may have, but not particularly limited, a structure including, for example, a base or releasing film (hereinafter, can be referred to as a "first film"); and the encapsulating layer formed on the base or releasing film as long as the crack barrier layer and the moisture barrier layer are included.

The encapsulation film of the present application may further include a base or releasing film (hereinafter, can be referred to as a "second film") formed on the encapsulating layer.

Figure 1:
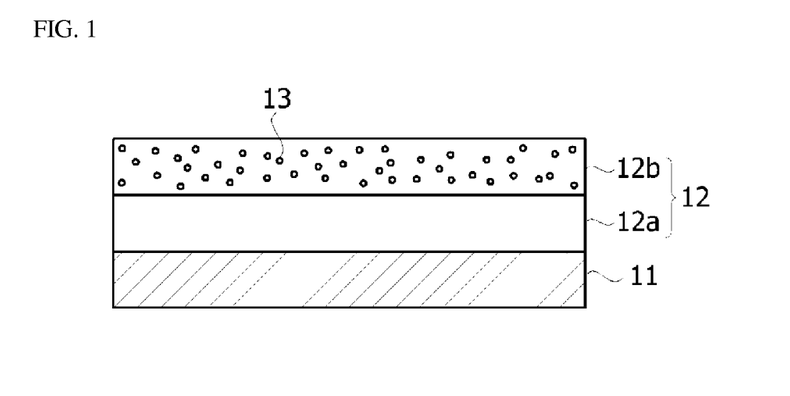
FIGS. 1 to 3 are cross-sectional views of an encapsulation film according to an exemplary embodiment of the present application.
Figure 2:
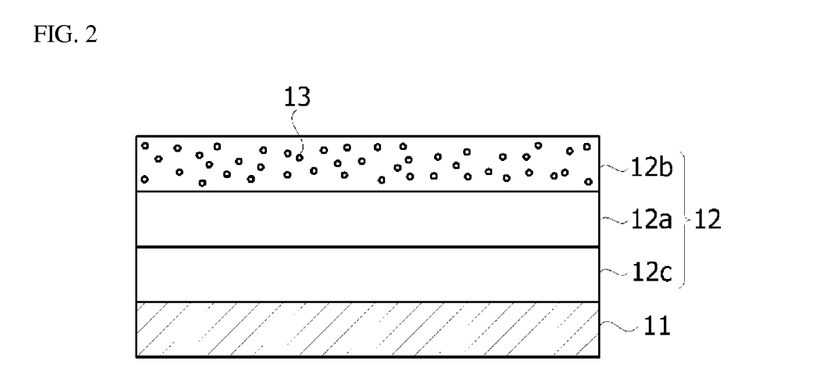
Figure 3:
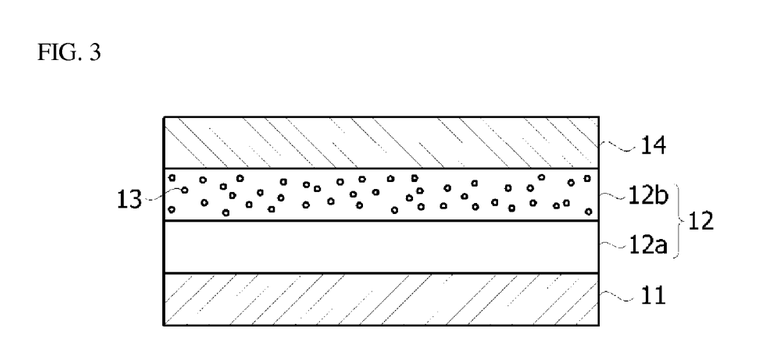

FIGS. 1 to 3 are cross-sectional views of an encapsulation film according to an exemplary embodiment of the present application.

As shown in FIGS. 1 and 2, the encapsulation film of the present application may include an encapsulating layer 12 formed on a base or releasing film 11. In FIG. 1, the encapsulating layer 12 included in the encapsulation film of the present application includes a moisture barrier layer 12b and a crack barrier layer 12a, and a moisture adsorbent 13 is present only in the moisture barrier layer 12b. In addition, in FIG. 2, an encapsulating layer 12 includes a crack barrier layer 12a, a moisture barrier layer 12b, and a laminating layer 12c.

In another aspect of the present application, as shown in FIG. 3, the encapsulation film of the present application may further include a base or releasing film 14 formed on the encapsulating layer 12. However, the encapsulation film shown in FIG. 3 is merely an aspect of the present application, and an order of stacking a crack barrier layer, a moisture barrier layer, and a laminating layer of the encapsulating layer may be changed as needed.

A specific kind of the first film that can be used in the present application is not particularly limited. In the present application, as the first film, a general polymer film in the art may be used. In the present application, for example, as the base or releasing film, a polyethyleneterephthalate film, a polytetrafluoroethylene film, a polyethylene film, a polypropylene film, a polybutene film, a polybutadiene film, a vinylchloride copolymer film, a polyurethane film, an ethylene-vinyl acetate film, an ethylene-propylene copolymer film, an ethylene-acrylic acid ethyl copolymer film, an ethylene-acrylic acid methyl copolymer film or a polyimide film may be used. In addition, one or both surfaces of the base or releasing film of the present application may be subjected to suitable releasing treatment. As an example of a releasing agent used in the releasing treatment of the base film, an alkyd-, silicon-, fluorine-, unsaturated ester-, polyolefin-, or wax-based releasing agent may be used, and among these, in terms of heat resistance, an alkyd-, silicon-, or fluorine-based releasing agent is preferably used, but the present application is not limited thereto.

In addition, a kind of the second film (hereinafter, can be referred to as a "cover film") that can be used in the present application is not particularly limited, either. For example, in the present application, as the second film, within the exemplary category of the above-described first film, one that is the same as or different from the first film may be used. In addition, in the present application, the second film may also be subjected to suitable releasing treatment.

In the present application, a thickness of the base or releasing film (the first film) is not particularly limited, and may be suitably selected according to an application. For example, in the present application, the first film may have a thickness of approximately 10 to 500 μm, and preferably, 20 to 200 μm. When the thickness is less than 10 μm, the base film may be easily modified in the manufacturing process, and when the thickness is more than 500 μm, economic feasibility is degraded.

In addition, in the present application, a thickness of the second film is not particularly limited, either. In the present application, for example, the thickness of the second film may be set the same as that of the first film. In the present application, in consideration of processability, the thickness of the second film may be set relatively smaller than that of the first film.

The thickness of the encapsulating layer included in the encapsulation film of the present application is not particularly limited, and in consideration of an application of the film, may be suitably selected according to the following conditions. However, the crack barrier layer of the encapsulating layer may have a smaller thickness than that of the moisture barrier layer. In the encapsulating layer included in the encapsulation film of the present application, for example, the crack barrier layer of the encapsulating layer may have a thickness of approximately 1 to 20 and preferably, 2 to 15 μm. When the thickness is less than 1 for example, when the encapsulation film of the present application is used as an encapsulant of the OED, an ability to protect the moisture barrier layer of the encapsulating layer from a damage factor may be degraded, and when the thickness is more than 20 an efficiency of the moisture preventability of the moisture barrier layer of the encapsulating layer may be degraded. The moisture barrier layer of the encapsulating layer may have a thickness of approximately 5 to 200 and preferably 5 to 100 μm. When the moisture barrier layer has a thickness of less than 5 sufficient moisture preventability may not be exhibited, and when the moisture barrier layer has a thickness of more than 200 processability is difficult to be ensured, and thickness expansion is increased due to moisture reactivity, thereby damaging a deposition film of the OED, and decreasing economic feasibility.

Another aspect of the present application provides a method of manufacturing an encapsulation film. The exemplary encapsulation film may be manufactured by molding the encapsulating layer in a film or sheet type.

In one example, the method may include applying a coating solution including components constituting the above-described encapsulating layer on a base or releasing film in a sheet or film type, and drying the applied coating solution. The method may also include attaching an additional base or releasing film on the dried coating solution.

The coating solution may be prepared by, for example, dissolving or dispersing the components of the above-described encapsulating layer in a suitable solvent. In one example, the encapsulating layer may be manufactured by a method of dissolving or dispersing the moisture adsorbent or filler in a solvent when needed, grinding the moisture adsorbent or filler, and mixing the grinded moisture adsorbent or filler with an encapsulation resin.

A kind of the solvent used in the preparation of a coating solution is not particularly limited. However, when a drying time of the solvent is excessively long, or drying at a high temperature is needed, problems may be generated in terms of workability or durability of the encapsulation film, and thus a solvent having a volatile temperature of 150° C. or less may be used. In consideration of film moldability, a small amount of the solvent having a volatile temperature in the range or more may be mixed. The solvent may be, but is not limited to, at least one or two of methylethylketone (MEK), acetone, toluene, dimethylformamide (DMF), methylcellosolve (MCS), tetrahydrofuran (THF), xylene, or N-methylpyrrolidone (NMP).

A method of applying the coating solution to the base or releasing film may be, but is not particularly limited to, a known coating method such as knife coating, roll coating, spray coating, gravure coating, curtain coating, comma coating, or lip coating.

The applied coating solution may be dried, and the solvent may be volatilized, thereby forming an encapsulating layer. The drying may be performed, for example, at 70 to 150° C. for 1 to 10 minutes. The drying condition may be changed in consideration of a kind of the used solvent.

Following the drying, an additional base or releasing film may be formed on the encapsulating layer.

Still another aspect of the present application provides a product for encapsulating an OED, which includes a substrate, an OED formed on the substrate, and the above-described encapsulation film encapsulating the OED, in which the encapsulation film is attached to an entire surface of the OED.

In the present application, the OED may be an OLED.

The product for encapsulating the OED may further include a protective film between the encapsulation film and the OED to protect the OED.

Figure 4:
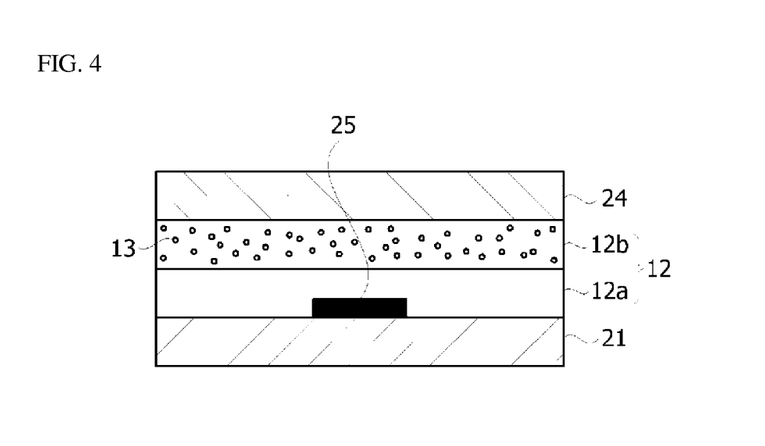
FIG. 4 is a cross-sectional view of an encapsulation product of an OED according to an exemplary embodiment of the present application.

The product for encapsulating the OED may further include a cover substrate on the encapsulation film to cover the encapsulation film. The substrate and the cover substrate may be disposed to face each other. In addition, the OED may be formed on one surface of the substrate, which may be a surface facing the cover substrate. The film may be disposed between the substrate and the cover substrate, and a crack barrier layer of the film may be disposed to be in contact with the substrate having the OED. In such a structure, the encapsulation film may substantially cover an entire surface of the OED. In one example, as shown in FIG. 4, the film may include a crack barrier layer 12a and a moisture barrier layer 12b, and the crack barrier layer 12a may be disposed to be in contact with an OED 25 and a substrate 21. In addition, a cover substrate 24 may be disposed on the moisture barrier layer 12b.

Yet another aspect of the present application provides a method of encapsulating an OED, which includes applying the above-described encapsulation film to a substrate on which the OED is formed to be attached to an entire surface of the OED, and curing the encapsulation film.

The encapsulation film may be applied to the OED by hot roll lamination, hot pressing, or vacuum pressing of the encapsulation film, but the present application is not particularly limited thereto.

In addition, a step of attaching a moisture barrier layer of the encapsulation film to an additional encapsulation material such as glass or a metal.

In the present application, according to the method of encapsulating the OED, for example, a transparent electrode is formed on the substrate such as a glass or a polymer film by vacuum deposition or sputtering, and an organic material layer is formed on the transparent electrode. The organic material layer may include a hole injection layer, a hole transport layer, an emitting layer, an electron injection layer, and/or an electron transport layer. Subsequently, a second electrode is further formed on the organic material layer. Afterward, the above-described encapsulation film is applied to a top surface of an OED 25 on a substrate 21 to cover an entire surface of the OED 25. Here, a method of applying the encapsulation film is not particularly limited, and may be a method of heating or pressing a cover substrate 24 (e.g., glass or a polymer film) to which the above-described encapsulating layer of the encapsulation film of the present application is previously transfer-printed to the top surface of the OED 25 formed on the substrate 21. In this step, for example, when the encapsulation film is transfer-printed on the cover substrate 24, the above-described encapsulation film may be transfer-printed on the cover substrate 24 using a vacuum press or vacuum laminator by applying heat after a base or releasing film formed on the film is peeled off. In this process, when a curing reaction of the encapsulation film is performed in a certain range or more, a cohesive strength or adhesive strength of the encapsulation film may be reduced, thereby preferably controlling a process temperature and a process time to approximately 100° C. or less and approximately within 5 minutes, respectively. Similarly, even when the cover substrate 24 on which the encapsulation film is transfer-printed is hot-pressed to the OED, a vacuum press or vacuum laminator may be used. A temperature condition for this step may be set as described above, and a process time may be within 10 minutes.

In addition, an additional curing process to the encapsulation film to which the OED 25 is pressed may be performed, and such a curing process (main curing) may be performed, for example, in a heating chamber or UV chamber. A curing condition in the main curing may be suitably selected in consideration of stability of the OED 25.

However, the above-described forming process is merely an example for encapsulating the OED 25, and thus a sequence of or condition for the process may be freely changed. For example, the sequence of the transfer-printing and pressing processes may be changed in such a manner that the above-described encapsulation film is transfer-printed to the OED 25 on the substrate 21, followed by pressing the cover substrate 24. In addition, after a protective layer is formed on the OED 25, the encapsulation film may be applied and then cured without the cover substrate 24.

EFFECTS

An encapsulation film of the present application can effectively block moisture or oxygen permeating into an OED from an external environment, prevent adhesion failure and damage to an organic film due to volume expansion occurring by a reaction between a moisture adsorbent and moisture, and provide high reliability due to increases in a lifespan and durability of the OED.

DETAILED DESCRIPTION OF EXEMPLARY EMBODIMENTS

Hereinafter, the present invention will be described in further detail with reference to Examples according to the present invention and Comparative Examples not according to the present invention, but the scope of the present invention is not limited to the following Examples.

Example 1

(1) Preparation of Solution for Crack Barrier Layer 100 g of a silane-modified epoxy resin (KSR-177, Kukdo Chemical Co., Ltd.), 100 g of a butadiene rubber-modified epoxy resin (KR-450, Kukdo Chemical Co., Ltd.), and 150 g of a phenoxy resin (YP-50, Tohto Kasei Co., Ltd.) were added to a reaction vessel at room temperature, and diluted with Methyl ethyl ketone (MEK). 4 g of imidazole (Shikoku Chemicals Co., Ltd.) was added as a curing agent to the homogenized solution, and stirred at a high speed for 1 hour, resulting in a solution for a crack barrier layer.

(2) Preparation of Solution for Moisture Barrier Layer

A moisture adsorbent solution was prepared by adding 100 g of calcined dolomite as a moisture adsorbent and MEK having a solid content of 50 wt % as a solvent. 200 g of a silane-modified epoxy resin (KSR-177, Kukdo Chemical Co., Ltd.) and 150 g of a phenoxy resin (YP-50, Tohto Kasei Co., Ltd.) were added to a reaction vessel at room temperature, and diluted with MEK. Afterward, 4 g of imidazole (Shikoku Chemicals Co., Ltd.) was added as a curing agent to the homogenized solution, and the resulting solution was stirred at a high speed for 1 hour, and thus a solution for a moisture barrier layer was prepared. The moisture adsorbent solution previously prepared was added to the resulting solution to have a content of the calcined dolomite of 50 parts by weight relative to 100 parts by weight of an encapsulating resin of a second layer, resulting in preparing a solution for a second layer.

(3) Manufacture of Film

A moisture barrier layer was formed to have a thickness of 40 μm by coating the solution for a moisture barrier layer previously prepared on a releasing surface of releasing PET and drying the coated surface at 110° C. for 10 minutes.

A crack barrier layer was formed to have a thickness of 15 μm by coating the solution for a crack barrier layer previously prepared on a releasing surface of releasing PET and drying the coated surface at 130° C. for 3 minutes.

The moisture barrier layer and the crack barrier layer were laminated, thereby manufacturing a multilayer film.

Example 2

An encapsulation film was manufactured by the same method as described in Example 1, except that 100 g of a silane-modified epoxy resin (KSR-177, Kukdo Chemical Co., Ltd.), 100 g of an acryl rubber-modified epoxy resin (KR-692, Kukdo Chemical Co., Ltd.), and 150 g of a phenoxy resin (YP-50, Tohto Kasei Co., Ltd.) were added to a reaction vessel at room temperature and diluted with MEK, and 4 g of imidazole (Shikoku Chemicals Co., Ltd.) was added as a curing agent to the homogenized solution and stirred at a high speed for 1 hour, resulting in a solution for a first layer.

Example 3

An encapsulation film was manufactured by the same method as described in Example 1, except that 50 g of a polyisobutene resin (weight average molecular weight: 450,000) as an encapsulation resin of a crack barrier layer and 50 g of a hydrogenated dicyclopentadiene-based resin (softening point: 125° C.) as a tackifier were added into a reaction vessel at room temperature, and 10 g of a DCPD-based epoxy resin and 1 g of imidazole (Shikoku Chemicals Co., Ltd.) were diluted with toluene to have a solid content of approximately 30 wt %.

Example 4

An encapsulation film was manufactured by the same method as described in Example 1, except that 50 g of a polyisobutene resin (weight average molecular weight: 450,000) as an encapsulation resin of a crack barrier layer and 50 g of a hydrogenated dicyclopentadiene-based resin (softening point: 125° C.) as a tackifier were added into a reaction vessel at room temperature, and 20 g of a multifunctional acryl monomer (TMPTA) and 1 g of a photoinitiator were diluted with toluene to have a solid content of approximately 25 wt %.

Example 5

An encapsulation film was manufactured by the same method as described in Example 1, except that 50 g of a polyisobutene resin (weight average molecular weight: 450,000) as an encapsulation resin of a crack barrier layer and 50 g of a hydrogenated dicyclopentadiene-based resin (softening point: 125° C.) as a tackifier were added into a reaction vessel at room temperature, and 10 g of a multifunctional acryl monomer (TMPTA) and 1 g of a photoinitiator were diluted with toluene to have a solid content of approximately 25 wt %.

Comparative Example 1

An encapsulation film was manufactured by the same method as described in Example 1, except that 200 g of a silane-modified epoxy resin (KSR-177, Kukdo Chemical Co., Ltd.) and 150 g of a phenoxy resin (YP-50, Tohto Kasei Co., Ltd.) were added to a reaction vessel at room temperature, and diluted with MEK, and a solution for a crack barrier layer was prepared by adding 4 g of imidazole (Shikoku Chemicals Co., Ltd.) as a curing agent to the homogenized solution, and stirring the resulting solution at a high speed for 1 hour.

Comparative Example 2

An encapsulation film was manufactured by the same method as described in Example 1, except that 180 g of a silane-modified epoxy resin (KSR-177, Kukdo Chemical Co., Ltd.), 50 g of a butadiene rubber-modified epoxy resin (KR-450, Kukdo Chemical Co., Ltd.), and 150 g of a phenoxy resin (YP-50, Tohto Kasei Co., Ltd.) were added to a reaction vessel at room temperature and diluted with MEK, and a solution for a crack barrier layer was prepared by adding 4 g of imidazole (Shikoku Chemicals Co., Ltd.) as a curing agent to the homogenized solution and stirring the resulting solution at a high speed for 1 hour.

Comparative Example 3

An encapsulation film was manufactured by the same method as described in Example 1, except that 50 g of a polyisobutene resin (weight average molecular weight: 450,000) as an encapsulation resin of a crack barrier layer and 60 g of a hydrogenated dicyclopentadiene-based resin (softening point: 125° C.) as a tackifier were added into a reaction vessel at room temperature, and diluted with toluene to have a solid content of approximately 30 wt %.

1. Measurement of Tensile Modulus

A coating film was manufactured to have a thickness of 40 μm by laminating the crack barrier layer or moisture barrier layer manufactured in Example or Comparative Example. A sample was prepared by cutting the manufactured coating film to a size of 50 mm×10 mm (length×width) by setting a coating direction in the manufacture to a length direction, and both sides of the sample were taped to only have a length of 25 mm. Subsequently, the taped parts were extended at a speed of 18 mm/min at 25° C., and a tensile modulus was measured.

2. Adhesion Failure in Evaluation of High Temperature and High Humidity Reliability A sample was manufactured by laminating the film manufactured in Example and Comparative Example on a cover substrate and between glass substrates, and pressured and thermal pressing the resulting substrate at 70° C. Afterward, the sample was maintained in a constant temperature and constant humidity chamber at 85° C. and a relative humidity of 85% for approximately 300 hours. When the adhesion failure occurred, it is represented as X, and when the adhesion failure did not occur, it is represented as O.

3. Heat Resistant Sustaining Property

After the encapsulating layer of Example or Comparative Example was attached to one end of a PET film having a size of 2.5 cm×5 cm to have a size of 2.5 cm×2.5 cm, and attached to one end of a different PET having the same size, one end of the resulting film was fixed, and 1 kg of a load was hung to the other end of the film in a chamber at 85° C. Through 24-hour observation, when the encapsulating layer was dislocated or the load was dropped, it was represented as X.

TABLE 1

| | Tensile modulus of moisture barrier layer | Tensile modulus of crack barrier layer | Adhesion failure in evaluation of high temperature and high humidity reliability | Heat resistant sustaining property |
|---|---|---|---|---|
| Example 1 | 650 MPa | 400 MPa | O | O |
| Example 2 | 900 MPa | 450 MPa | O | O |
| Example 3 | 900 MPa | 100 MPa | O | O |
| Example 4 | 900 MPa | 10 MPa | O | O |
| Example 5 | 900 MPa | 1 MPa | O | O |
| Comparative Example 1 | 1 GPa | 900 MPa | X | O |
| Comparative Example 2 | 900 MPa | 550 MPa | X | O |
| Comparative Example 3 | 900 MPa | 0.005 MPa | O | X |

DESCRIPTION OF REFERENCE NUMERALS 11, 14: base or releasing film
12: encapsulating layer
12a: crack barrier layer
12b: moisture barrier layer
12c: laminating layer
13: moisture adsorbent
21: substrate
24: cover substrate
25: organic electronic device

What is claimed is:

1. An encapsulation film for encapsulating an organic electronic device, comprising:
an encapsulating layer comprising a crack barrier layer having a tensile modulus of 0.001 to 500 mpa at room temperature and a moisture barrier layer having a tensile modulus of 500 to 1000 mpa at room temperature, of which the crack barrier layer is formed to be in contact with the organic electronic device upon encapsulation of the organic electronic device, wherein the crack barrier layer and the moisture barrier layer comprise an encapsulation resin or a moisture adsorbent.

2. The film according to claim 1, wherein the crack barrier layer comprises an encapsulation resin having a glass transition temperature of 0° C. or less.

3. The film according to claim 2, wherein the encapsulation resin is a styrene-based resin, a polyolefin-based resin, a thermoplastic elastomer, a polyoxyalkylene-based resin, a polyester-based resin, a polyvinylchloride-based resin, a polycarbonate-based resin, a polyphenylenesulfide-based resin, a mixture of hydrocarbon, a polyamide-based resin, an acrylate-based resin, an epoxy-based resin, a silicon-based resin, a fluorine-based resin, or a mixture thereof.

4. The film according to claim 2, wherein the encapsulation resin is a copolymer of an olefin-based compound comprising a carbon-carbon double bond.

5. The film according to claim 1, wherein the moisture barrier layer comprises an encapsulation resin having a glass transition temperature of 85° C. or more.

6. The film according to claim 5, wherein the encapsulation resin comprises a curable resin.

7. The film according to claim 6, wherein the curable resin comprises an epoxy resin comprising a cyclic structure in a molecule structure.

8. The film according to claim 6, wherein the curable resin is a silane-modified epoxy resin.

9. The film according to claim 1, wherein the moisture adsorbent is included in the crack barrier layer at 0 to 20% and in the moisture barrier layer at 80 to 100% based on a total weight of the moisture adsorbent in the encapsulation film.

10. The film according to claim 1, wherein the moisture adsorbent is a moisture reactive adsorbent, a physical adsorbent, or a mixture thereof.

11. The film according to claim 10, wherein the moisture reactive adsorbent is alumina, a metal oxide, a metal salt, or phosphorus pentoxide, and the physical adsorbent is silica, zeolite, zirconia, titania, or montmorillonite.

12. The film according to claim 10, wherein the moisture reactive adsorbent is at least one selected from the group consisting of $P_2O_5$, $Li_2O$, $Na_2O$, BaO, CaO, MgO, $Li_2SO_4$, $Na_2SO_4$, $CaSO_4$, $MgSO_4$, $CoSO_4$, $Ga_2(SO_4)_3$, $Ti(SO_4)_2$, $NiSO_4$, $CaCl_2$, $MgCl_2$, $SrCl_2$, $YCl_3$, $CuCl_2$, CsF, $TaF_5$, $NbF_5$, LiBr, $CaBr_2$, $CeBr_3$, $SeBr_4$, $VBr_3$, $MgBr_2$, $BaI_2$, $MgI_2$, $Ba(ClO_4)_2$, and $Mg(ClO_4)_2$.

13. The film according to claim 1, wherein the crack barrier layer further comprises a tackifier.

14. The film according to claim 13, wherein the tackifier is a hydrogenated cyclic olefin-based polymer.

15. The film according to claim 1, wherein the encapsulating layer further comprises a laminating layer, the laminating layer is disposed below the crack barrier layer, and the laminating layer is formed to be in contact with the organic electronic device upon encapsulation of the organic electronic device.

16. The film according to claim 15, wherein the laminating layer comprises an encapsulation resin or a moisture adsorbent.

17. A product for encapsulating an organic electronic device, comprising:
a substrate;
an organic electronic device formed on the substrate; and
the encapsulation film according to claim 1 to encapsulate the organic electronic device,
wherein the encapsulation film is attached to an entire surface of the organic electronic device.

18. The product according to claim 17, wherein the organic electronic device is an organic light emitting diode.

19. A method of encapsulating an organic electronic device, comprising:
applying the encapsulation film according to claim 1 to a substrate on which an organic electronic device is formed to be attached to an entire surface of the organic electronic device; and
curing the encapsulation film.

* * * * *